United States Patent
Tomasevic et al.

[19]

[11] Patent Number: 6,118,357
[45] Date of Patent: Sep. 12, 2000

[54] WIRELESS MMIC CHIP PACKAGING FOR MICROWAVE AND MILLIMETERWAVE FREQUENCIES

[75] Inventors: Petar Tomasevic, Rancho Palos Verdes; Mark Kintis, Manhattan Beach, both of Calif.

[73] Assignee: TRW Inc., Redondo Beach, Calif.

[21] Appl. No.: 09/250,735

[22] Filed: Feb. 15, 1999

[51] Int. Cl.[7] .................................................. H01L 23/043
[52] U.S. Cl. ........................... 333/247; 333/664; 333/728
[58] Field of Search ............................. 333/247; 257/664, 257/728

[56] References Cited

U.S. PATENT DOCUMENTS

| 5,049,978 | 9/1991 | Bates et al. | 333/247 X |
| 5,406,125 | 4/1995 | Johnson et al. | 333/247 X |
| 5,977,631 | 11/1999 | Notani | 333/247 X |

*Primary Examiner*—Justin P. Bettendorf
*Attorney, Agent, or Firm*—Michael S. Yatsko

[57] ABSTRACT

A wireless MMIC chip packaging scheme where the MMIC chip (38) is maintained right side up. The MMIC chip (38) is positioned within a cavity (40) of a fixture (42), where a backside metal layer (44) of the chip (38) is mounted to the fixture (42) by a conductive epoxy layer (48). RF and DC via feedthroughs (62, 64) are strategically provided through the chip (38), and are electrically connected to isolated islands (70) in the backside metal layer (44). Substrates (52, 56) are provided that carry microstrips (54) and electrical traces (56), and that extend below the chip (38) so that ends of the microstrips (54) and traces (56) make an electrical connection with the isolated islands (70). In an alternate design, the substrate (80) extends completely across the backside of the chip (38), and ground vias (84) extend through the substrate (80) to connect the backside metal layer (44) to the fixture (42).

23 Claims, 6 Drawing Sheets

WIRELESS MMIC CHIP PACKAGING FOR MICROWAVE AND MILLIMETERWAVE FREQUENCIES

BACKGROUND OF THE INVENTION

1. Field of the Invention

This invention relates generally to wireless packaging for an integrated circuit chip and, more particularly, to wireless packaging for an MMIC chip that includes providing RF and DC via feedthroughs extending into the chip from top circuit layer to backside of the chip to directly connect RF and DC inputs and outputs to microstrips and traces formed on a substrate positioned relative to the backside of the chip.

2. Discussion of the Related Art

Millimeter-wave and/or microwave integrated circuit (MMIC) chips are used in many types of electrical systems that transfer signals at millimeter-wave and microwave frequencies. The millimeter-wave or microwave electrical systems will generally include one or more MMIC chips packaged within a suitable housing. Substrates are positioned within the housing to support microstrips and the like to provide RF connections between the MMIC chips and provide DC power input connections to the chips. The high frequency signals at these wavelengths require specialized RF and DC input and output connections to the chip suitable for state-of-the-art MMIC assembly technology and to minimize losses in a cost effective manner.

In one MMIC chip packaging design, the RF inputs and outputs and DC power inputs to the MMIC chip employ ribbonbond and wirebond connections to connect the chip to the microstrips on the substrates. FIG. 1 shows a top plan view of a conventional MMIC chip 10 employing these types of electrical connections. The MMIC chip 10 is mounted at its backside within a cavity 12 of a packaging fixture 14 by a suitable conductive epoxy, solder or the like to position and protect the chip 10. The fixture 14 can be made of any suitable conductive material, such as an aluminum or brass, and is generally maintained at a reference potential, such as ground. The chip 10 includes a backside metal layer 16 acting as a ground plane that covers the entire back surface of the chip 10. The epoxy or solder connection between the metal layer 16 and the fixture 14 provides the common reference potential connection to the chip 10. In alternate designs, the backside metal layer 16 can be at a bias potential, free floating, etc. An electrical layout section 18 is formed on GaAs substrate and includes the electrical components associated with the MMIC chip 10 depending on the particular application. In this plan view, the size of the layer 16 is shown exaggerated relative to the layout section 18 to better depict the input and output connections to the chip 10 that will be discussed below.

The chip 10 includes a plurality of ground vias 20 that extend through the chip 10 and are connected to the layer 16 to allow the electrical components within the section 18 of the chip 10 to be connected to the common reference potential. A plurality of DC pads 22 are mounted on top of the chip 10 and are electrically connected to conductive traces 24 that extend into the fixture 14 by wirebonds 26. The DC pads 22 are appropriately connected to the components in the section 18 to provide DC voltage potentials to be applied to the components within the chip 10. Microstrips 28 are patterned on non-conductive substrates 30 positioned within the fixture 14 to transfer the high frequency RF microwave or millimeterwave signals to and from the chip 10. The substrates 30 extend through the fixture 14 into the cavity 12, as shown. Ribbonbonds 32 are electrically connected to the microstrips 28 and to conductive pads 34 on top of the chip 10. The pads 34 are electrically connected to microstrip lines 36 on the chip 10 to transmit the high frequency RF signals to the electrical components in the section 18. The ground vias 20 that are provided adjacent to the pads 34 allow for on-wafer measurement capabilities, or for co-planar connection applications, as is well understood in the art. The ribbonbonds 32 generally have a bowed configuration to provide play for thermal and mechanical stresses. In this design, the substrates 30 are at the same level as the chip 10 such that the microstrips 28 are substantially parallel with the top surface of the chip 10, so that the wirebonds 26 and the ribbonbonds 32 provide the electrical connections to the top of the chip 10 in an efficient manner.

The connection technique using the wirebonds 26 and the ribbonbonds 32 for the design discussed above, has a number of drawbacks. Particularly, this technique is somewhat labor intensive in that it requires an operator to carefully make the wirebond and ribbonbond connections. Additionally, the ribbonbond connections to the MMIC chip 10 degrade the chip performance because the ribbonbonds 32 add a finite inductance in series with the MMIC chip 10. This ribbonbond inductance degrades performance, which is most noticeable at microwave and millimeterwave frequencies. It is known in the art that the inductance generated by each ribbonbond 32 can be using an off-chip matching network (not shown) that includes an open circuit stub matching network that negates the inductance of the ribbonbonds 32, and produces a low pass filter network that prevents the inductive reactance from degrading circuit performance. However, this method of inductance compensation is time consuming to implement, and requires separate substrate designs depending on the length and the thickness of the connecting ribbon.

Other methods of providing RF inputs and outputs to an MMIC chip are known in the art that do not use ribbonbonds. One method is generally referred to as flip-chip circuit technology, and employs a wireless connection to the MMIC chip. In flip-chip circuit technology, the face (top) of the processed MMIC chip 10 is soldered or epoxied to a connecting substrate instead of the backside metal layer. Referring to FIG. 1, in the flip-chip design, the chip 10 would be flipped over, and various connection points in the electrical layout section 18 would be electrically connected to solder bumps or the like formed on traces on a mounting substrate to provide the appropriate connections to the chip 10.

Flip-chip circuit technology, however, also has several disadvantages. These disadvantages include trapping heat between the MMIC chip and the mounting substrate because the MMIC chip surface cannot take advantage of heat convection from air circulation. Additionally, the MMIC chip cannot be visually inspected for failure mechanisms after the MMIC chip is mounted on the substrate because the face of the chip is covered by the mounting substrate, and the electrical connections between the MMIC chip and the substrate cannot be checked because the connections are not exposed. Also, the circuit design has to be in coplanar technology. Coplanar technology has notable disadvantages at microwave frequencies: heat dissipation, chip size, and allows only for low level circuit complexity. Further, when the chip is flipped over and mounted to the substrate, the circuit performance changes from when the chip was tested when right side up.

Thus, there is a need for a wireless MMIC chip interconnection process which allows heat dissipation and troubleshooting of the installed MMIC chip. It is therefore an object of the present invention to provide such a wireless MMIC chip packaging scheme for MMIC microstrip circuits.

SUMMARY OF THE INVENTION

In accordance with the teachings of the present invention, a wireless MMIC chip packaging technique is disclosed where the MMIC chip is mounted right side up. The chip is positioned within a cavity of a fixture, where a backside metal layer of the chip is mounted to the fixture by a conductive epoxy bond or the like. RF and DC via feedthroughs are strategically provided through the chip, and are electrically connected to isolated conductive islands designed in the backside metal layer. Substrates are provided that support microstrips and electrical traces, and that extend into the cavity below the chip so that ends of the microstrips and traces make an electrical connection with the isolated islands. Conductive pads are provided on top of the chip and are connected to the RF and DC via feedthroughs to provide for accessible testing locations. In an alternate design, the substrate extends completely across the backside of the chip, and ground vias are provided through the substrate to connect the backside metal layer to the fixture.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiments directed to a wireless packaging technique for an MMIC chip is merely exemplary in nature, and is in no way intended to limit the invention or its applications or uses.

Figure 2:
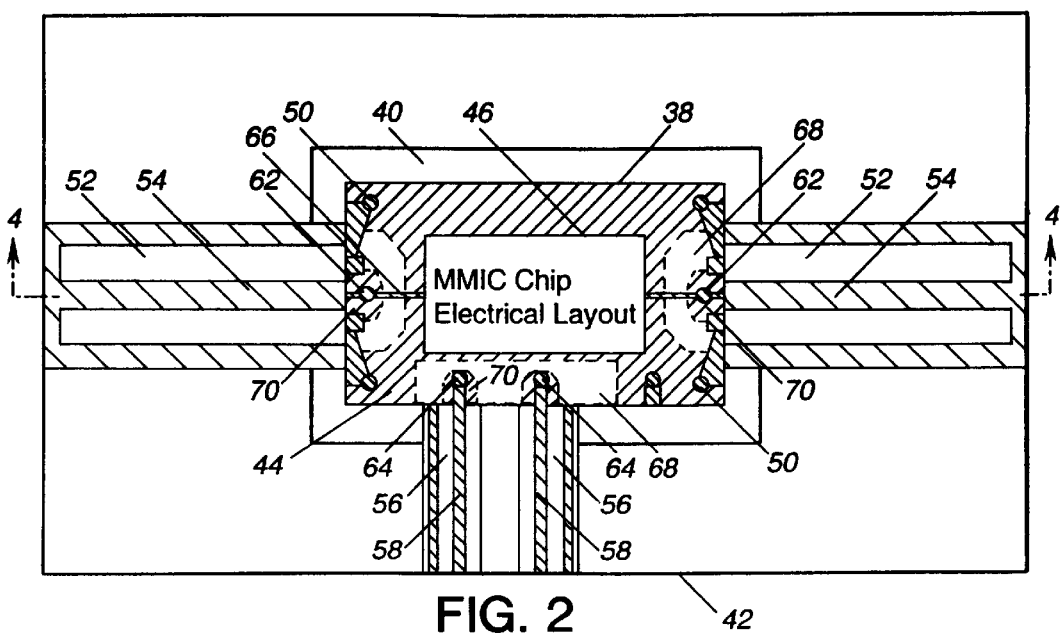
FIG. 2 is a top plan view showing a wireless packaging scheme for an MMIC chip, according to an embodiment of the present invention.
Figure 3:
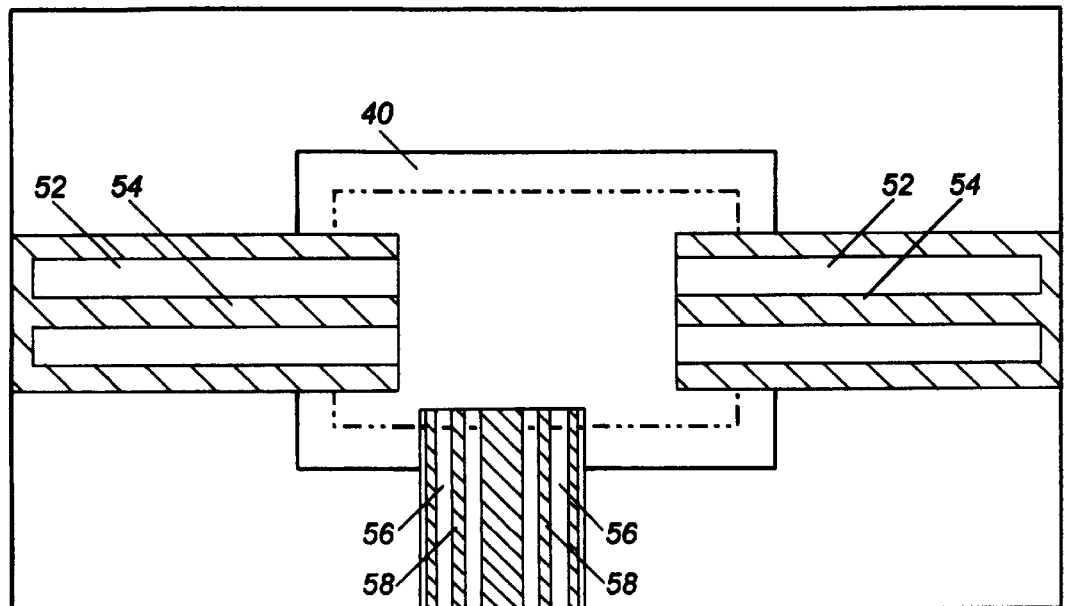
FIG. 3 is another top plan view of the wireless packaging scheme for an MMIC chip shown in FIG. 2.
Figure 4:
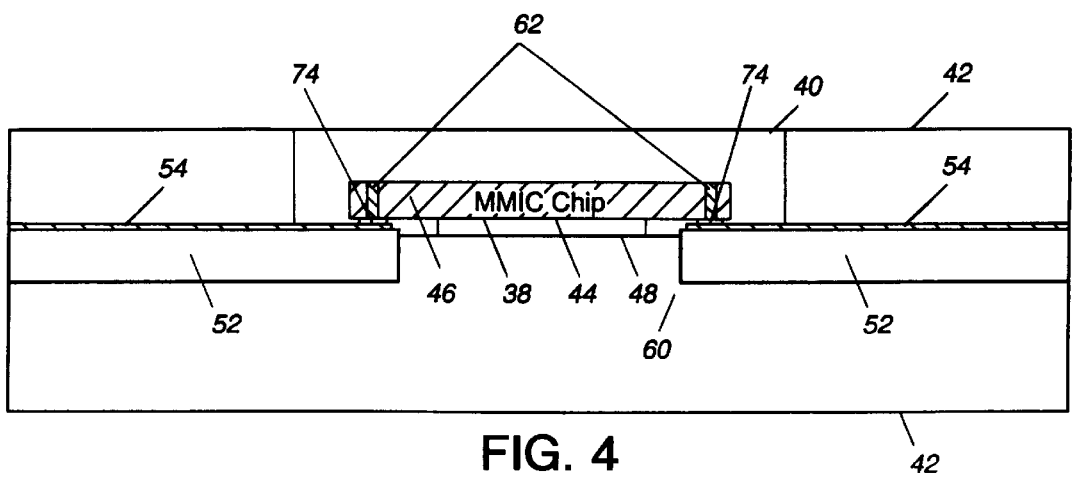
FIG. 4 is a side plan view of the packaging scheme shown in FIGS. 2 and 3.

FIG. 2 is a top plan view showing an MMIC chip 38 positioned within a cavity 40 of a conductive packaging fixture 42, according to an embodiment of the present invention. This plan view is also depicted in FIG. 3 where the chip 38 has been removed and a dotted rectangular box represents the position of the chip 38. Additionally, FIG. 4 shows a side plan view of the chip 38 and the fixture 42 through line 4—4 of FIG. 2. As with the chip 10 above, the chip 38 includes a backside metal layer 44 acting as a ground plane. The chip 38 is mounted to the fixture 42 by a conductive epoxy layer 48 attached to the metal layer 44 to provide a ground reference potential connection to the chip 38, and hold the chip 38 at the desirable location within the cavity 40. A plurality of ground vias 50 connect backside metal 44 to top of chip, through GaAs substrate, providing reference potential to electrical layout 46.

Figure 1:
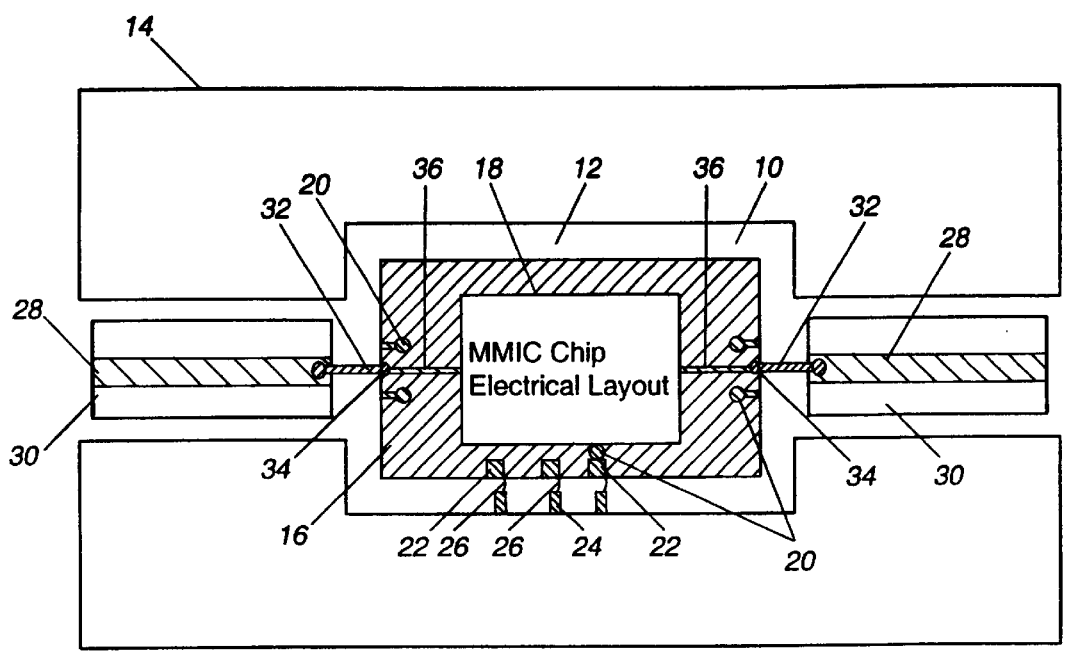
FIG. 1 is a top plan view of a conventional MMIC chip packaging layout using wirebond and ribbonbond connections.

In this embodiment, substrates 52 are provided to support RF microstrips 54 and substrates 56 are provided to support DC traces 58. The substrates 52 and 56 can be made out of any suitable high dielectric non-conductive material, such as alumina. Each of the substrates 52 and 56 extend into the cavity 40 below the chip 38 to position the microstrips 54 and the traces 58 at the appropriate location below the chip 38, and thus, the substrates 52 and 56 are not on the same plane as the chip 38 as with the embodiment shown in FIG. 1. This is represented by the darkened areas around the substrates 52 and 56. A raised portion 60 of the fixture 42 is provided below the chip 38 and between the substrates 52 and 54 to allow the chip 38 to be readily mounted to the fixture 42 by the epoxy layer 48 within the design of the present invention.

In order to provide a wireless connection to the DC traces 58 and the RF microstrips 54 at the appropriate connection points on the chip 38, in accordance with the teachings of the present invention, a plurality of RF via feedthroughs 62 and DC via feedthroughs 64 are provided that extend through the chip 38, as shown. A conductive pad is provided on the top surface of the chip 38 where each via feedthrough 62 and 64 extends through to provide for testing locations and the like on top of the chip 38. Likewise, conductive pads are provided on the bottom surface of the chip 38 using layer 44 to provide a backside electrical connection to the via feedthroughs 62 and 64. Microstrip traces 66 are provided on the top surface of the chip 38 to electrically connect the RF feedthrough 62 to the components within the layout section 46.

To electrically isolate the via feedthroughs 62 and 64 from the metal layer 44, the metal layer 44 is appropriately etched away to create open areas 68 in the layer 44. Portions of the metal layer 44 remain as islands 70. Therefore, the entire backside of the chip 38 is not metalized.

The ground vias 50 at the ends of the chip 38 proximate the microstrips 66 are moved away from the microstrips 66 to be removed from the open areas 68 to make the electrical connection. The via feedthroughs 62 extend through the chip 38 and make electrical contact with a solder or epoxy connection 74 that is in electrical contact with the microstrips 54. Likewise, the DC via feedthroughs 64 extend through the chip 38 and make contact with a solder or conductive epoxy contact, that in turn makes electrical contact with the traces 58. Thus, the chip 38 is maintained right side up, includes pads for electrical access to the desirable testing connection points within the chip 38, and makes a wireless contact to the suitable microstrips 52 and DC traces 56 for connection within the electrical assembly.

Figure 5:
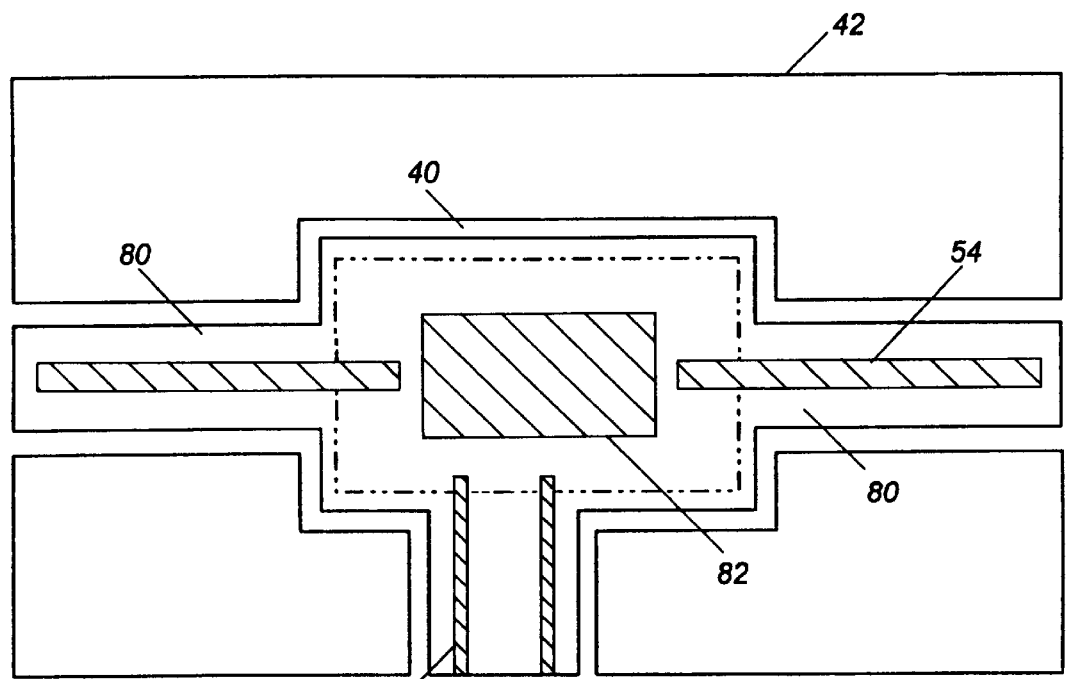
FIG. 5 is top plan view depicting a wireless packaging scheme for an MMIC chip, according to another embodiment of the present invention.
Figure 6:
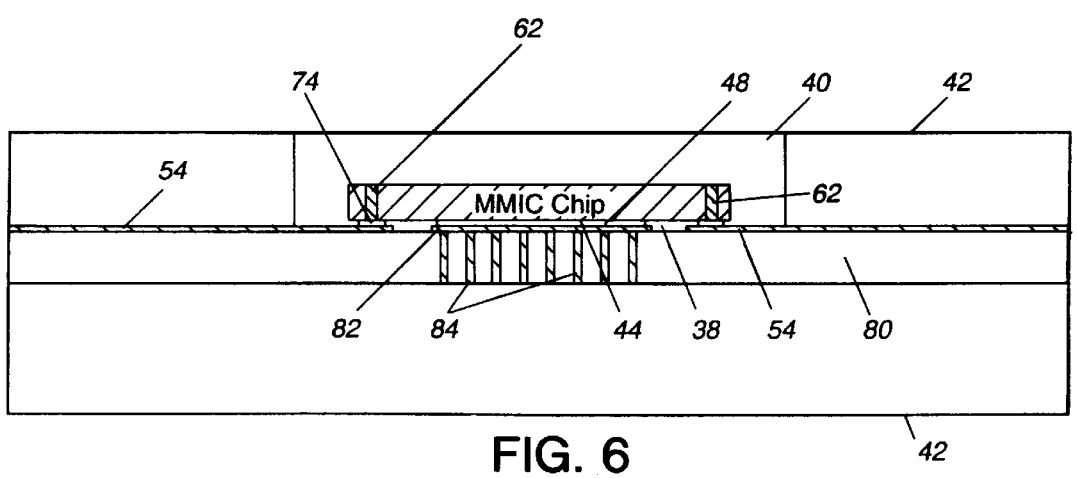
FIG. 6 is a side plan view of the packaging scheme shown in FIG. 5.

FIG. 5 shows a plan view and FIG. 6 shows a cross-sectional view of an MMIC chip layout scheme, according to another embodiment of the invention. In these figures, like components are numbered with the same reference numeral as those reference numerals in FIGS. 2–4. In this embodiment, the substrates 52 and 56 are replaced with a single substrate 80 that extends completely through the cavity 40 across the bottom of the chip 38. Because the substrate 80 is not conductive, and the chip 38 would therefore not be electrically connected to the fixture 42 for reference potential purposes, suitable modifications must be made to connect the backside metal layer 44 to the fixture 42. In this regard, an elevated ground plane 82 is provided on the substrate 80 in electrical contact with the conductive epoxy layer 48. To electrically connect the ground plane 82 to the fixture 42, a plurality of ground vias 84 are provided through the substrate 80 to contact the ground plane 82, thus making the reference potential connection to the backside metal layer 44.

The packaging scheme of the invention allows the front side of the MMIC chip 38 to be visually inspected for failures and defects even after it is attached to the substrate, and allows the chip 38 to transfer heat to the atmosphere. Moreover, the invention can be accomplished using presently known GaAs processing steps with no additional masking steps because the via hole technology already is utilized on the GaAs wafer, and wafer backside processing is presently performed to produce waferscribe lanes on three inch GaAs wafers.

Figure 7:
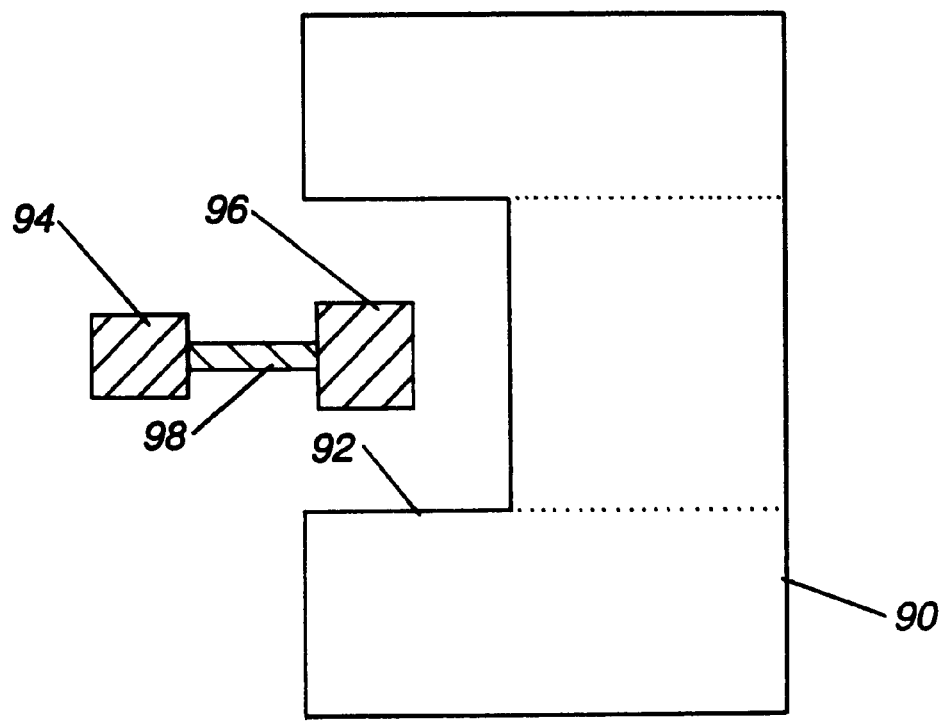
FIG. 7 is a simulation depicting inductive tuning elements used in connection with the packaging design of the invention.

The use of the RF via feedthroughs 62 alters the impedance matching between the microstrips 54 and the electrical components of the chip 38. Therefore, tuning elements must be provided to adjust the inductive and capacitive effects of the microstrip and via connections. FIG. 7 shows a simulation at the bottom level of the chip 38 and top of microstrip substrate to provide inductive tuning to satisfy this purpose. In this simulation, a section 90 represents the backside metal 44, an open area 92 represents the open area 68, a strip section 94 represents the microstrip 54, and a pad section 96 represents the connection point to the via feedthrough 62 at the bottom of the chip 38. A narrower inductive transition section 98 between the strip section 94 and the pad section 96 is provided between the microstrip 54 and the via feedthrough 62 for the tuning purposes.

Figure 8:
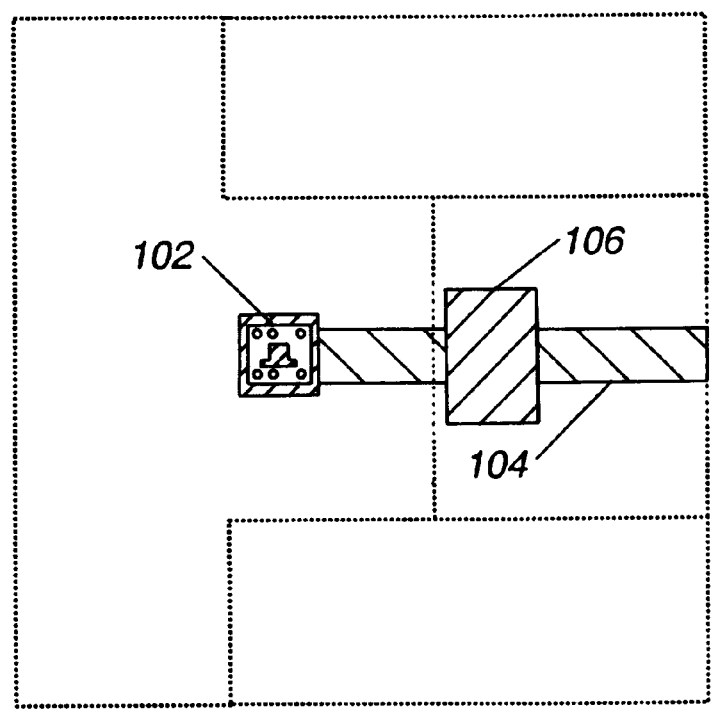
FIG. 8 is a simulation depicting capacitive tuning elements used in connection with the packaging design of the invention.

FIG. 8 shows a simulation at the top level of the chip 38. A section 102 represents the top pad and RF via feedthrough 62, a strip section 104 including a widened section 106 is added to the top of the chip 38 to provide a capacitance between the section 104 and the backside metal layer 44 to provide capacitive tuning. Both capacitative and inductive tuning are used in conjunction in this design.

Figure 9A:
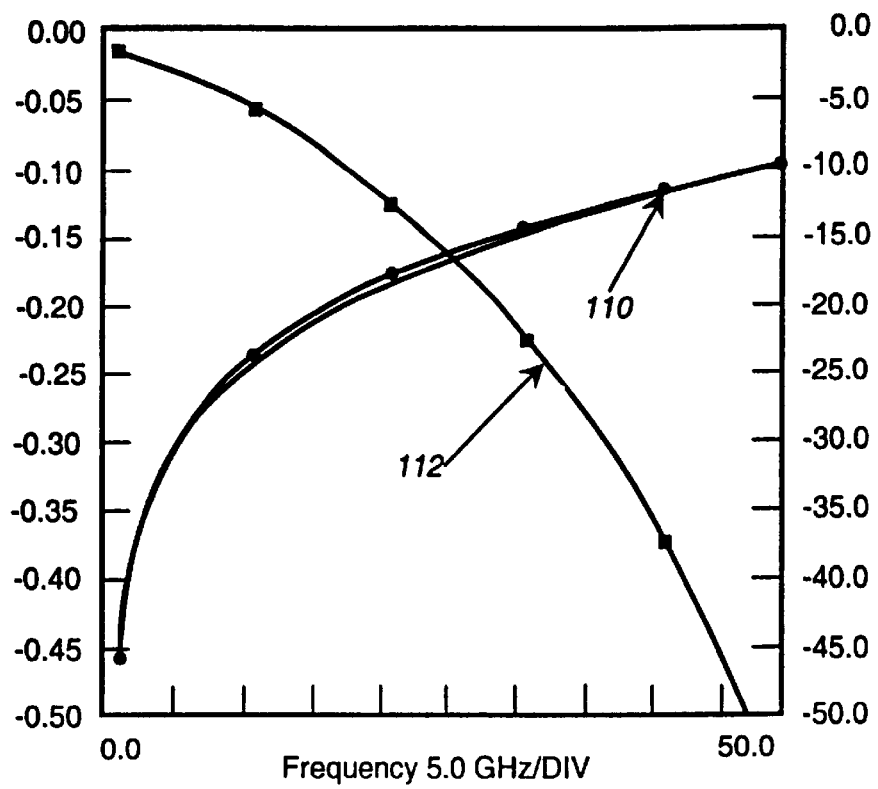
FIGS. 9(a) and 9(b) show electromagnetic simulations depicting the performance of the MMIC chip with and without the tuning elements shown in FIGS. 7 and 8.
Figure 9B:
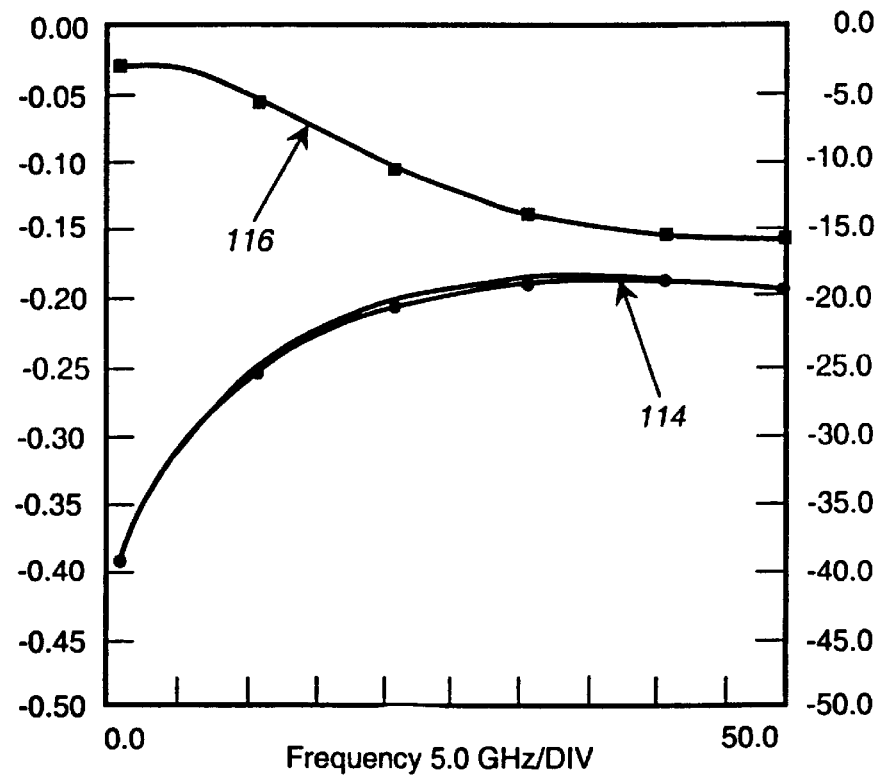

FIGS. 9(a) and 9(b) are graphs that show the results of providing this tuning, where frequency is on the horizontal axis and power loss in dB is on the vertical axis. FIG. 9(a) shows return loss due to RF via structure on graph line 110 and insertion loss on graph line 112 without the tuning elements depicted in FIGS. 7 and 8. At 50 GHz, there is a return loss of −10.0 dB. FIG. 9(b) shows return loss at RF via structure on graph line 114, and insertion loss on graph line 116 with the tuning elements depicted in FIGS. 7 and 8. As is apparent, the tuning elements provide for improved insertion loss and return loss across RF via structure. In this example, use of specified tuning elements can achieve greater than 19 dB return loss at 50 GHz, and less than 0.18 dB insertion loss.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

What is claimed is:

1. A packaging assembly for an electrical circuit, said assembly comprising:
    a conductive packaging housing including a cavity;
    at least one non-conductive substrate extending into the cavity, said at least one substrate including at least one microstrip formed on the substrate; and
    an integrated circuit chip positioned within the cavity relative to the substrate where the packaging housing completely surrounds the integrated circuit chip and the substrate extends through the housing into the cavity, said integrated circuit chip including a backside metal layer positioned adjacent to the at least one substrate in the cavity, said integrated circuit chip further including at least one via feed-through extending into the integrated circuit chip and being electrically connected to the at least one microstrip adjacent to the backside metal layer, said via feed-through providing an electrical connection to the chip.

2. The assembly according to claim 1 further comprising a conductive epoxy layer, said epoxy layer mounting the integrated circuit chip to the housing, said epoxy layer being connected to the backside metal layer to provide a reference potential connection to the chip.

3. The assembly according to claim 1 further comprising an elevated ground plane, said at least one substrate extending completely across the bottom of the chip so that it opposes the metal layer, said ground plane being positioned on the substrate between the substrate and the chip.

4. The assembly according to claim 3 further comprising a conductive mounting layer, said conductive layer being connected to the backside metal layer and the elevated ground plane to provide a reference potential connection to the metal layer.

5. The assembly according to claim 3 further comprising a plurality of ground vias connected to the housing and extending through the substrate and contacting the ground plane.

6. The assembly according to claim 1 further comprising an electrical isolation region formed in the backside metal layer to electrically isolate the at least one via feed-through from the metal layer.

7. The assembly according to claim 1 further comprising DC pads attached to a top surface of the chip and electrically connected to the at least one via feed-through.

8. The assembly according to claim 1 wherein the at least one substrate extends into the cavity relative to the metal layer and below the integrated circuit chip.

9. The assembly according to claim 1 wherein the integrated circuit chip is selected from the group consisting of monolithic microwave integrated circuit chips and monolithic millimeter-wave integrated circuit chips.

10. The assembly according to claim 1 wherein the at least one via feed-through provides an RF electrical connection to the integrated circuit chip.

11. The assembly according to claim 1 wherein the at least one via feed-through provides a DC electrical connection to the integrated circuit chip.

12. The assembly according to claim 1 further comprising inductive and capacitive tuning elements electrically connected to the at least one via feed-through.

13. The assembly according to claim 1 wherein the at least one via feed-through is a plurality of via feed-throughs that provide all of the RF and DC connections to the integrated circuit chip.

14. A wireless packaging assembly for an electrical circuit, said assembly comprising:

a conductive packaging fixture including a cavity;

at least one non-conductive substrate extending into the cavity, said at least one substrate including a plurality of microstrips formed thereon; and an MMIC chip including a backside metal layer, said chip being mounted within the cavity so that the at least one substrate below opposes the backside metal layer, wherein the packaging fixture completely surrounds the integrated circuit chip and the substrate extends through the fixture into the cavity, and wherein a conductive mounting layer mounts the chip to the fixture and provides a reference potential connection to the chip, said MMIC chip further including a plurality of RF via feedthroughs and DC via feedthroughs extending into the integrated circuit chip and being electrically connected to the plurality of microstrips adjacent to the backside metal layer, said backside metal layer being patterned to provide electrically Isolated regions where the via feedthroughs contact the microstrips.

15. The assembly according to claim 14 further comprising an elevated ground plane, said substrate extending completely across the bottom of the chip so that it Opposes the metal layer, said ground plane being positioned on the substrate between the substrate and the chip.

16. The assembly according to claim 14 further comprising a plurality of ground vias connected to the fixture and extending through the substrate and contacting the ground plane.

17. The assembly according to claim 14 further comprising inductive and capacitive tuning elements electrically connected to the via feed-throughs.

18. A method of providing wireless electrical connections to an integrated circuit, comprising:

fabricating the integrated circuit to have a backside metal layer and a plurality of via feedthroughs extending through the integrated circuit;

providing a conductive packaging fixture including a cavity;

positioning at least one non-conductive substrate within the fixture that extends into the cavity, said at least one substrate including a plurality of microstrips formed thereon; and mounting the integrated circuit within the cavity so that the plurality of via feedthroughs make electrical contact with the plurality of microstrips adjacent the backside metal layer and packaging fixture completely surrounds the integrated circuit chip and the substrate extends through the fixture into the cavity.

19. The method according to claim 18 wherein the backside metal layer is formed to include electrically isolated regions around the via feedthroughs to electrically isolate the via feedthroughs from the backside metal layer.

20. The method according to claim 18 wherein providing the at least one substrate includes providing the substrate completely across a bottom of the chip and providing an elevated ground plane on the substrate that opposes the backside metal layer.

21. The method according to claim 20 further comprising providing a plurality of ground vias through the substrate to electrically connect the ground plane to the fixture.

22. The method according to claim 18 wherein positioning at least one substrate includes positioning the substrate below the integrated circuit so that the plurality of microstrips oppose the backside metal layer.

23. The method according to claim 18 wherein the integrated circuit is an MMIC chip and the plurality of via feedthroughs provide RF and DC inputs and outputs to the MMIC chip.

* * * * *